United States Patent [19]
Agonafer et al.

[11] Patent Number: 5,370,178
[45] Date of Patent: Dec. 6, 1994

[54] CONVERTIBLE COOLING MODULE FOR AIR OR WATER COOLING OF ELECTRONIC CIRCUIT COMPONENTS

[75] Inventors: Dereje Agonafer; Timothy M. Anderson; Gregory M. Chrysler; Richard Chao-fan Chu; Robert E. Simons, all of Poughkeepsie, N.Y.; David T. Vader, Mechanicsburg, Pa.

[73] Assignee: International Business Machines Corporation, Armonk, N.Y.

[21] Appl. No.: 111,675

[22] Filed: Aug. 25, 1993

[51] Int. Cl.[5] .................. H01L 23/467; H01L 23/473
[52] U.S. Cl. ................... 165/137; 165/80.3; 165/80.4; 165/185; 361/697; 361/699; 361/703
[58] Field of Search .............. 165/137, 185, 912, 122, 165/80.3, 80.4; 361/697, , 698, 699, 703, 695

[56] References Cited
U.S. PATENT DOCUMENTS

| | | | |
|---|---|---|---|
| 2,912,624 | 11/1959 | Wagner | 361/395 |
| 3,590,915 | 7/1971 | Riedel et al. | 165/185 |
| 4,520,245 | 5/1985 | Ito | 361/397 |

FOREIGN PATENT DOCUMENTS 2178243  4/1987  United Kingdom ............... 361/395

*Primary Examiner*—Albert W. Davis, Jr.
*Attorney, Agent, or Firm*—Lawrence D. Cutter; James E. Murray

[57] ABSTRACT

A convertible cooling module, especially for use in conjunction with a wide range of computer systems ranging from workstations to massively parallel processors is employable with both air and water cooling systems. In particular, a cooling module is convertible from a heat sink modality to an air cooling modality, and finally to a liquid cooling modality in response to either increased performance demands or an increase in the number of processors or circuit components employed. The conversion may be carried out in the field and provides a flexible and less costly upgradeability path for computer customers.

13 Claims, 4 Drawing Sheets

CONVERTIBLE COOLING MODULE FOR AIR OR WATER COOLING OF ELECTRONIC CIRCUIT COMPONENTS

BACKGROUND OF THE INVENTION

The present invention is generally directed to a cooling module which is especially useful for either air or water cooling of electronic circuit components, particularly those used in computer systems. More particularly, the present invention is directed to a flexible cooling system for a range of computer systems extending from workstation devices to massively parallel processing system complexes. Even more particularly, the apparatus of the present invention provides increased thermal flexibility and cooling upgradeability to computer installations at lower cost, with greater reliability and without the necessity of system down time.

It has been the trend in customer workstation installations to link a number of computer systems together. Typically, these can take the form of a Local Area Network (LAN) to facilitate cooperative work between the users and to ensure the maximum utilization of each computer system. Additionally, in some installations groups of workstations are being linked together to form loosely coupled parallel processing machines. In the limit, large numbers of workstation processors may be packaged together to form massively parallel supercomputer systems. It is therefore seen that one of the trends in the computer industry is the combination of sub-assemblies of electronic circuit boards into larger systems. Accordingly, it is seen that it is very desirable that these sub-assemblies be configured to facilitate their use in workstations, workstation clusters and also in massively parallel machines. However, the cooling requirements for these various systems are very different. Nonetheless, it would still be desirable to have a cooling methodology which extends across this whole range of computational devices, which is relatively inexpensive to implement and yet which provides flexible and field upgradeable systems.

One of the possibilities for cooling advanced processor circuit modules is the employment of arrays of parallel plates (fins) which may be employed as heat sinks. Heat generated in an electronic component is conducted into the plates and dissipated through the passage of a forced flow of ambient air within high aspect ratio flow channels between the fins. In future machines, as power levels per module increase, the combined heat dissipated by many machines in a confined work space, whether they are independent or part of a large LAN, could exceed the capacity of the room air conditioning system in which the systems are placed. In this case, it would be desirable if the installation could employ an alternative of a liquid cooling mechanism for these workstations using chilled water from a central Coolant Distribution Module (CDM). The option of air or water cooling for the sub-assemblies is also desirable for cooling massively parallel machines. In such cases, the cooling demands are often present from the point of initial system installation. However, as the number of processors is expanded, even in massively parallel machines, it is seen that it is desirable to have flexibility in terms of cooling capacity. While the total heat load generated from smaller machines may well be dissipated into the ambient atmosphere, and eventually controlled by means of a building air conditioning system, the heat load generated by a large machine, containing hundreds or even thousands of processor sub-assemblies packaged into a small volume, would almost certainly be too large (hundreds of kilowatts) to dissipate directly to the room air environment.

It is also noted that from a thermal perspective, thin plates used as heat sinks cannot be simultaneously optimized for both air and water (or other liquid or refrigerant) cooling. This limitation imposes additional constraints upon the design of any computer cooling system which is meant to span a range of system performance levels (workstations at the low end to massively parallel processors at the high end).

SUMMARY OF THE INVENTION

In accordance with a preferred embodiment of the present invention, a convertible cooling module includes a base plate for thermal transfer together with a plurality of thermally conductive plates which are affixed to the base plate and which are disposed substantially parallel to one another so as to define fluid flow paths between the plates. There is further included a flow path divider plate mechanism which is disposed substantially perpendicularly to the plates and which acts to define two distinct fluid flow paths through the plates, particularly when used in conjunction with a surrounding adapter shroud.

In accordance with one embodiment of the present invention, the cooling module described above is further provided with an air flow adapter which comprises a shroud which is at least partially disposable around the fin plates and which includes an air moving means disposed at one end of the flow path with the shroud being open to the atmosphere at the other end of the flow path. This adapter in conjunction with the convertible cooling module provides a mechanism for air or other gaseous flow cooling of electronic assemblies which are in thermal contact with the base plate.

Furthermore, in the present invention, the air flow adapter shroud is removable and replaceable with a liquid flow adapter which comprises a shroud which is sealably disposed against the plates and base. The shroud is configured so that, in conjunction with the plates and the flow path divider, multiple flow paths are defined through the collection of thermally conductive plates. In a preferred embodiment of the present invention, the liquid flow adapter shroud provides a mechanism for the flow of liquid coolant material (such as water or even a refrigerant) in a first direction through the plates and subsequently for flow in the opposite direction on the other side of the flow path divider.

In operation, it is a simple matter to remove the air flow adapter shroud assembly and to replace it with a liquid flow adapter shroud assembly. In particular, the system of the present invention is specifically designed so that this conversion may be performed in the field after a machine has been shipped to the customer and which may even have been in service for some time. The present invention requires minimal disruption to the installation environment.

Accordingly, it is an object of the present invention to provide a convertible cooling module for computer systems, thus providing such systems with either an air flow cooling mechanism or a liquid flow cooling mechanism.

It is yet another object of the present invention to provide a single cooling system which may be employed over a large range of computer systems ranging from workstations all the way to large massively parallel processing systems.

It is a still further object of the present invention to reduce the cost of providing cooling systems to computer customer installations.

It is also an object of the present invention to provide a cooling system having field upgradeability without significant increase in system down-time for user installations.

It is still another object of the present invention to increase the reliability of computer systems, to improve system performance characteristics, and in fact to increase the possibility of employing the same computer system at higher power levels, as determined, for example, by clock frequency.

Lastly, but not limited hereto, it is an object of the present invention to lower manufacturing costs and to reduce the number of parts employed in a wide range of computer systems.

DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
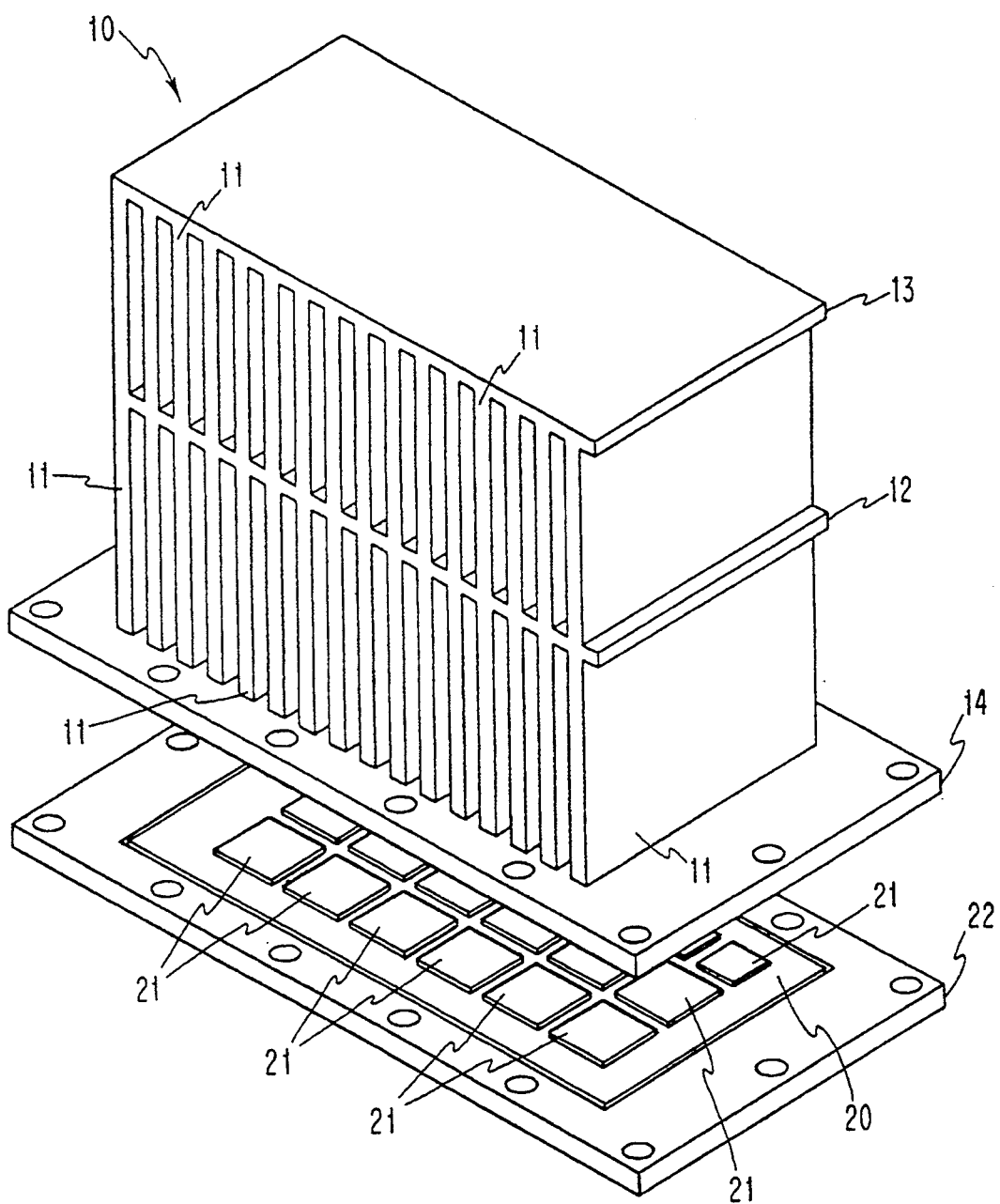
FIG. 1 is a isometric view illustrating a convertible cooling module in accordance with the present invention and in particularly, one such module used in conjunction with an electronic circuit board subassembly.

FIG. 1 illustrates in isometric view, one embodiment of cooling module 10 of the present invention. In particular, FIG. 1 illustrates the use of the present invention as a heat sink in conjunction with an electronic component circuit board 20 on which there are disposed a plurality of electronic chip devices 21. The heat generated by these devices is transferred by conduction to heat sink base 14 (see details in FIG. 5). The thermal conduction is preferably enhanced by the utilization of a thin layer of thermally conductive paste disposed between chips 21 and heat sink base 14. Typically, the thermally conductive paste is disposed in a layer which is only approximately 5 mils in thickness. Nonetheless, significantly improved thermal conduction results.

As a primary heat dissipation mechanism, thermally conductive plates 11 are affixed to heat sink base 14. Plates 11 are disposed parallel to one another and define a flow path for either the flow of air or water between the plates. Plates 11 are preferably disposed in a high aspect ratio configuration, substantially as shown in FIG. 1. This provides not only a large surface area for thermal transfer from heat sink 10 to a flowing fluid, but also serves to partition the fluid flow into a plurality of distinct streams. Additionally, it is noted that heat sink 10 may also optionally include top plate 13 which also contributes to structural rigidity, particularly when high aspect ratio flow paths are present. Plates 11 preferably comprise a highly thermally conductive material such as copper which is particularly advantageous in that its superior conductivity permits taller, more efficient fins, and it is compatible with (i.e. not subject to galvanic corrosion) water cooling systems containing conventional copper and/or brass plumbing and components. Plates 11 may be affixed to heat sink base 14 by brazing, soldering and other conventional methods. Typically, it is noted that heat sink base 14 also preferably comprises a material such as copper for enhanced heat flow purposes. It is noted that while the discussion herein has so far placed emphasis on the various parts of heat sink 10, it is possible to fabricate this structure from a single cast metal pouring or by such plate-fin lamination techniques as are described in Ellsworth and Vader (1991, 1992), Mahaney and Vader (1993), Ellsworth, Nuccio, Mahaney and Vader (In Press). Ellsworth, M. J. and Vader, D. T. (1991) "Cooling Package with Flow Through Heat Sinks for Single and Multi-chip Microelectronic Circuit Modules", IBM TDB, Vol. 34, No. 3, pages 290-293. Ellsworth, M. J. and Vader, D. T. (1992), "Laminate Heat Sink", IBM TDB, Vol. 35, No. 4A, Pages 378-379. Mahaney, H. V. and Vader, D. T. 1993), "Laminated Heat Sink with Variable Fin Heights", IBM TDB, Vol. 36, No. 4, pages 43-44. In fact, based on cost and design flexibility, plate fin lamination is the preferable method of manufacture.

Of particular import for the functioning of the present invention, there is provided a flow path divider plate means 12 which is disposed substantially perpendicularly to the plates 11. Divider plate means 12 provides a mechanism for defining dual fluid flow paths, particularly, though not exclusively, when used in conjunction with an adapter shroud as more particularly described below. Divider plate 12 serves an important role when upgrading an air cooled machine to a liquid cooled machine.

While it is noted that the cooling modules of the present invention may be employed with a shroud having a built-in fan, it is also possible to employ the invention with a separate fan but with no shroud. This may occur if the cooling demand is relatively light or if exterior frame or packaging walls partially or wholly serve a function of directing air between the plates. This would not preclude later inclusion of a shroud with a more directed air flow.

It is also noted that while FIG. 1 illustrates the presence of only a single divider 12, it is possible to employ multiple divider plates and correspondingly more individual flow paths. Such arrangements would not necessarily require each flow path to feed an adjacent flow path. These configuration variations provide a tradeoff between cost, complexity, increased seal area versus a more uniform temperature gradient along the flow path.

Figure 2:
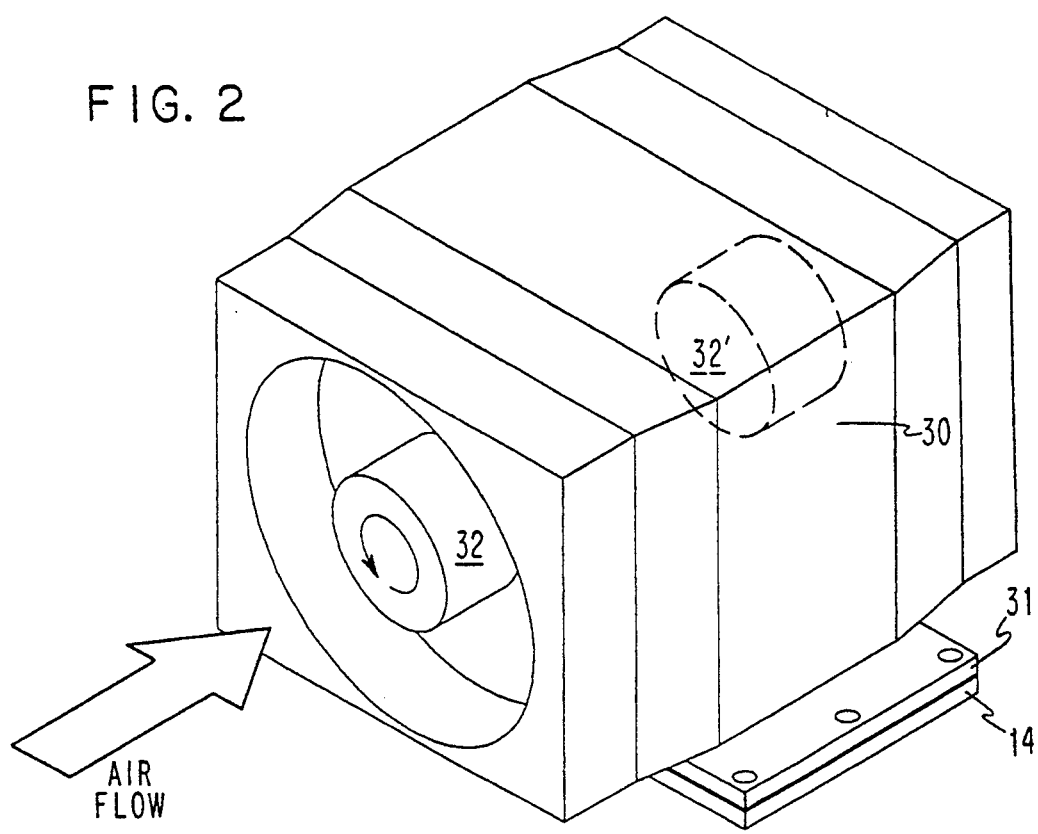
FIG. 2 is a isometric view illustrating the use of the convertible cooling module shown in FIG. 1 (not visible) in conjunction with a surrounding air flow adapter shroud.

A significant advantage of the cooling module shown in FIG. 1 is that it is readily adaptable for use in conjunction with a separate shroud which provides enhanced air cooling capacity. In particular, attention is directed to FIG. 2 in which cooling module 10 (no longer visible) is surrounded by shroud 30 which is open at both ends. However, at one end of shroud 30 there is preferably disposed an air moving device 32 comprising, for example, a motor driven fan. Thus, fan 32 provides a forced flow of air through the high aspect ratio channels shown in FIG. 1. It is also noted that for purposes of cooling equipment which should exhibit a high degree of reliability, it is preferable to employ dual air moving means substantially in the configuration shown in FIG. 2 except that such means are disposed at both the entrance and the exits of the air flow path. Thus, if one air moving mechanism fails, the additional flow demands can be taken up by the second air flow mechanism. This second device 32' is therefore preferably designed so that, by increasing power to the device, the same cooling capacity can be maintained if one of the fan mechanisms fails. Thus, blowers are preferably matched in push-pull pairs, one on the upstream side and one on the downstream side of plates 11. This is to ensure high reliability and availability of the cooling system, such that the system is continuously available. Thus the cooling module, is designed to be fully functional with only one blower operational since the operating blower is capable of operating at an increased rate of rotation to compensate for loss of its companion air moving device. Shroud 30 also preferably includes mating plate 31 for attachment of shroud 30 to heat sink base 14.

Figure 3:
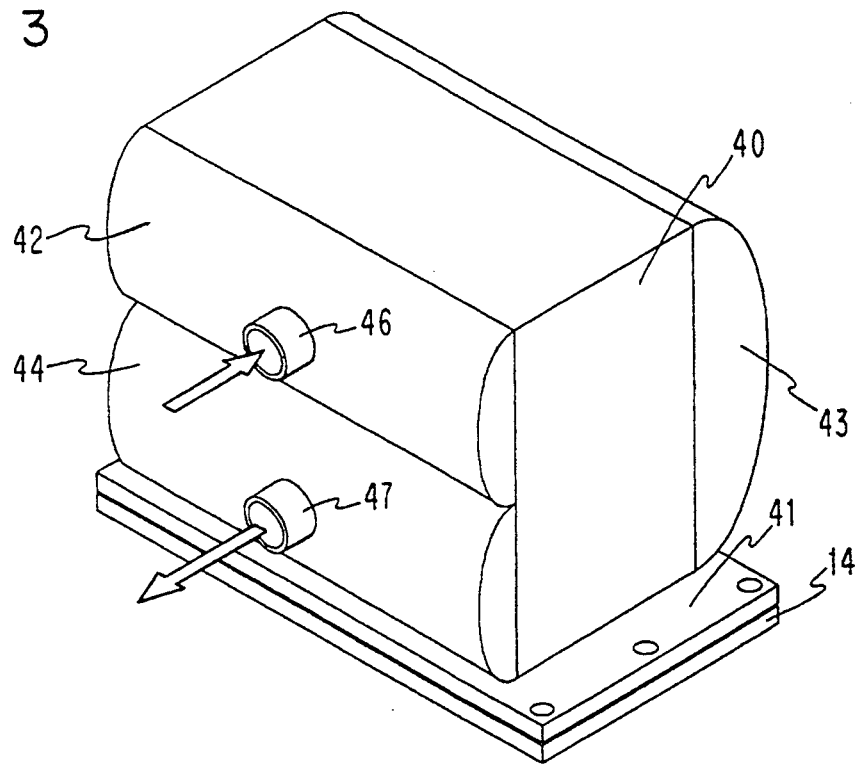
FIG. 3 is also an isometric view illustrating the utilization of the convertible cooling module shown in FIG. 1 (again not visible) in use in conjunction with a liquid flow adapter.

Alternatively, a shroud which is particularly useful for providing water cooling may be installed, substantially as shown in FIG. 3. Shroud 40 surrounds cooling module 10 (which is again therefore not visible in the view shown) and preferably includes liquid inlet 46 supplying manifold 42 and which also preferably includes exit outlet 47 which is supplied from manifold 44. On the back side of shroud 40 shown in FIG. 3 there is present manifold portion 43 which preferably receives liquid flow from the top portion and which in turn supplies the same liquid flow to the bottom portion of the cooling module. Internally, manifolds 42 and 44 are kept from being in direct fluid communication with one another by means of flow path divider means 12 (see FIG. 1). Shroud 40 also preferably includes mating plate 41 for sealable attachment of shroud 40 to heat sink base 14. Thus, a flow path is provided through cooling module 10 in a first direction and then in an opposite direction. Thus, shroud 40 in conjunction with cooling module 10 defines a fluid flow path extending in a first direction and then in an opposed direction. While the flow of fluid may in fact be opposite to that shown in FIG. 3, the preferred flow direction is nonetheless as shown since this provides a more uniform cooling process with respect to electronic circuit components which are in thermal contact with heat sink base 14 to which shroud 40 is affixed.

It is noted that since the cooling function is essentially accomplished by means of heat sink 10, shrouds 30 and 40 may in fact comprise polymeric material. Such material might in fact include plastics such as polycarbonate resins. This means that the shell or shroud itself may be made of a light weight non-conductor by conventional low cost methods used in mass production, including injection molding. Interior surfaces of the shroud, and the presence of divider means 12 provide multiple, serial flow passes through heat sink 10, and in the case of very tall plates can serve to restrict the flow of liquid to the bottom portion of plates 11. Restricting the flow of fluid to the bottom portion of plates 11 tends to correct for the fact that the optimum plate height for water cooling is typically less than the plate height needed for air cooling. FIG. 3 herein shows an example of a two pass heat dissipation mechanism with no flow blockage. Heat is rejected from the plates to chilled water (or another coolant or refrigerant as needed) that is supplied to one or more processors from a coolant distribution unit. The combined heat load of all modules that are water cooled is dissipated through the Coolant Distribution Module to supplied building chilled water.

Figure 4:
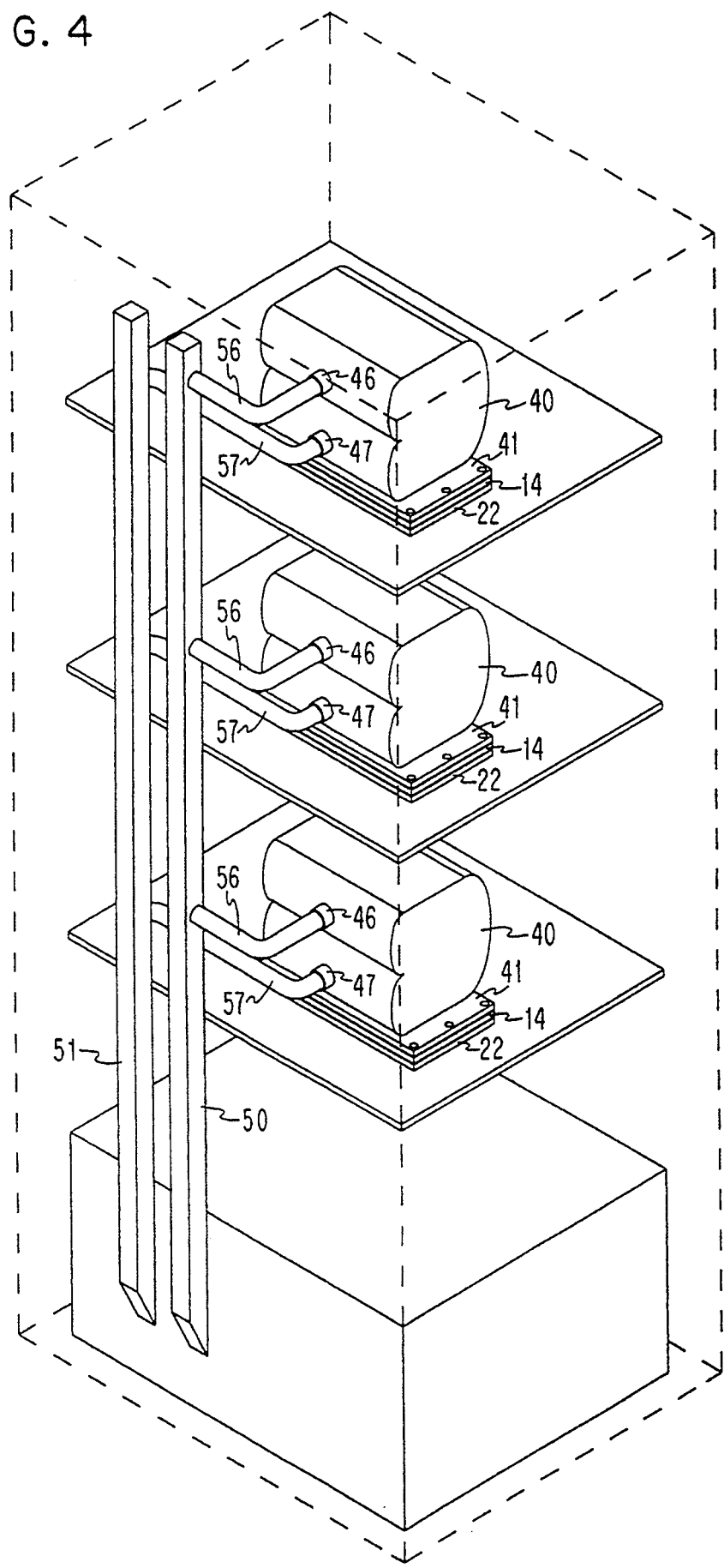
FIG. 4 is an isometric view illustrating a computer system employing the cooling mechanism of the present invention.

FIG. 4 illustrates an embodiment of the present invention in which a plurality of heat sinks 10 are employed in conjunction with shroud 40 to provide cooled water to computer or other electronic systems. In particular, there is shown cold water manifold 50 which through conduit 56 is coupled to inlet 46 of shroud 40. In a similar fashion, warm water exit manifold 51 is connected via conduit 57 to outlet 47 of shroud 40. As pointed out above, this is the preferred direction of flow.

Figure 5:
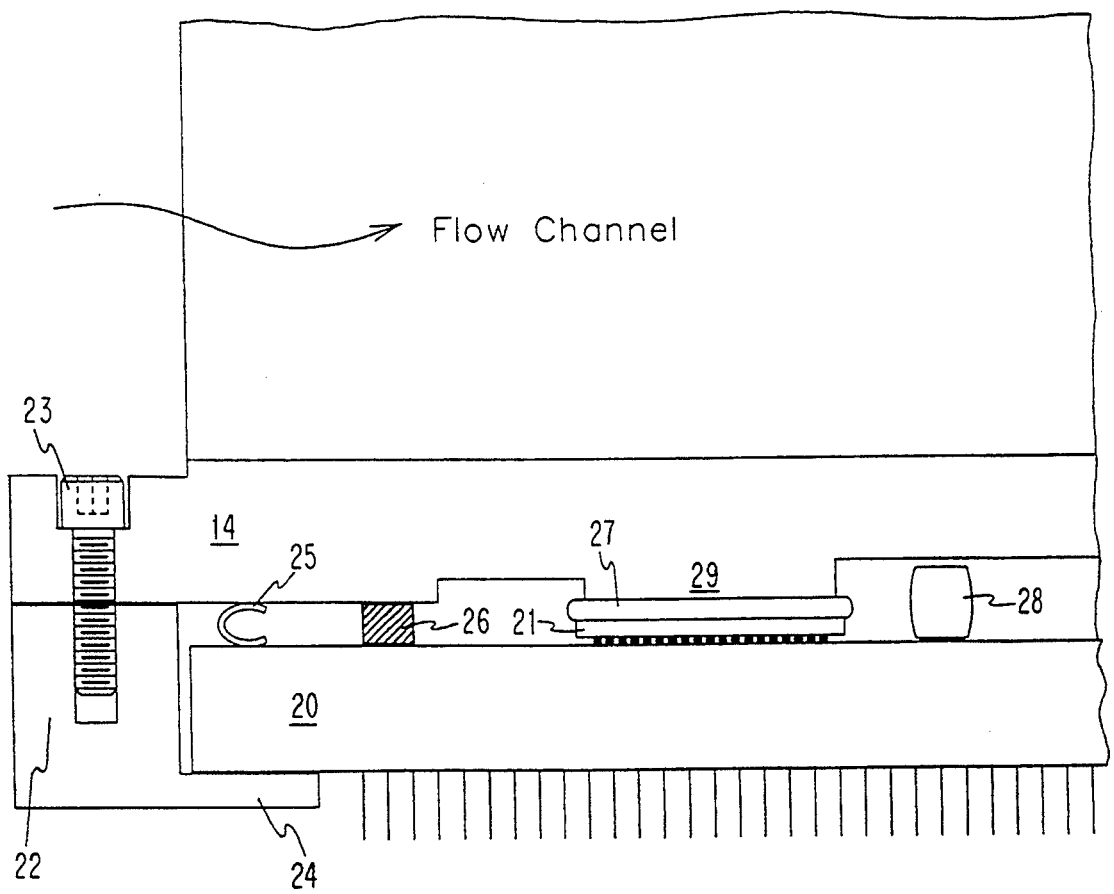
FIG. 5 is a cross-sectional side elevation view more particularly illustrating the relationship and interface between the base plate and the electronic sub-assembly which is cooled.

In the opposite direction, in terms of level of detail, FIG. 5 illustrates more particularly the thermal interface between heat sink base 14 and electronic circuit component sub-assembly 20. In particular, it is to be noted that heat sink base 14 may include one or more raised portions 29 that are particularly configured so as to be in close thermal contact with chip 21. It is further noted that in preferred embodiments of the present invention there is provided thermally conductive paste 27, as described above, which is disposed between chip 21 and heat sink base 14. (The thickness of layer 27 of thermally conductive paste is, however, not drawn to scale in the drawing shown, but rather has been exaggerated for purposes of better illustrating its role and position.) However, it is noted that chip-to-heat-sink thermal joining is not limited herein to the use of thermal conductivity enhancing paste. It is also possible to provide a piston and oil system.

One of the reasons for possibly contouring the lower side of heat sink base 14 might include the presence of electronic circuit components such as device 28 as shown. Such devices might include capacitors, power devices, resistors or other surface components which exhibit a higher profile than chip 21. It is additionally noted that there is also preferably provided spacer 26 which, in view of dimensional tolerances for multiple components, guarantees the required thickness of thermal paste 21, and proper compression of seal 25. There is also preferably provided seal means 25 which might comprise a C-ring, 0-ring or any other convenient elastomeric material which is designed to provide a seal between heat sink base 14 and substrate 20. Electronic sub-assembly 20 and heat sink 10 are mechanically joined via module base plate 22. Heat sink 10 is attached to the electronic sub-assembly by cap screws 23, while compression of spacer 26 between heat sink 10 and electronic sub-assembly 20 holds the electronic sub-assembly rigidly against base plate lip 24.

FIG. 5 illustrates the situation in which heat sink base 14 acts as the thermal cup for contact with chips 21 on electronic component substrates 20. However, it is also possible to provide a separate cap with areas such as raised portion 29 for mating to a specific subassembly of chip devices. Such a cap has a planar surface which mates directly with a correspondingly planar surface of heat sink base 14.

Accordingly, it is seen that the cooling module shown in FIG. 1 together with its adaptations for both air and water cooling serve to achieve the objectives indicated above. In particular, the same plate assembly, into which heat from the circuit components is conducted, serves both and air and water cooling functions. This greatly reduces manufacturing and development costs since the circuit module packages for stand alone workstations, workstation clusters and massively parallel machines are identical. The cooling mode may be selected in the factory at the time of manufacture, but is also readily alterable in the field by service personnel. Some installations may start out with an air cooled workstation, and later expand to several workstations such that the combined heat load increases beyond the capacity of the room air conditioning system. In such a case, a field engineer can remove the air cooling shrouds at the customer site and replace them with a higher capacity water cooling shell and a coolant distribution unit. While it is noted that, from a thermodynamic prospective, the plate assemblies cannot be simultaneously optimized for both air and water cooling, nonetheless the advantages of this invention lie in meeting the unique installation demands for versatility, expendability and low cost. Since a single design can span many machine and environmental requirements and readily accommodate the expansion of a user's computer facility to new or multiple machines, both development and manufacturing costs are reduced. Cost is also reduced because expansion is accomplished without the purchase of new module cooling hardware, and also because of the manufacturing savings which can be passed on to the computer system user.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents.

What we claim is:

1. A convertible cooling module, especially for air or liquid cooling of electronic circuit components, said module comprising:
    a base plate;
    a plurality of thermally conductive plates affixed to one side of said base plate, said conductive plates being disposed parallel to one another, whereby a fluid flow path through said conductive plates is defined;
    a circuit module carrier coupled to the opposite side of said base plate to form a sealed enclosure with said base plate with said opposite side in thermally conductive contact with caps of circuit modules within said enclosure;
    flow path divider plate means disposed substantially perpendicularly to said plates so as to define at least two distinct fluid flow paths through said conductive plates;
    a set of two shrouds, one shroud for directing fluid flow in one direction in one of the fluid flow paths and in the other direction in the other of the fluid flow paths and the other of the shrouds for directing fluid flow in the same direction in both the fluid flow paths; and
    means for attaching one of the two shrouds to the convertible cooling module whereby said convertible cooling module is adaptable for use in varying thermal load conditions.

2. The cooling module of claim 1 wherein said shroud attached to the convertible cooling module is disposed at least partially around said plates, said shroud including air moving means disposed at one end of said flow path and wherein said shroud is open at the other end of said flow path.

3. The module of claim 2 in which said air moving means comprises a fan.

4. The module of claim 2 in which there is present a second air moving means at the open end of said shroud.

5. The module of claim 2 in which said shroud comprises a polymeric material.

6. The cooling module of claim 1 further including means for causing fluid to flow through at least one of said flow paths.

7. The module of claim 1 in which said fin plates comprise material selected from the group consisting of copper and aluminum.

8. The combination of an electronic circuit component board and said cooling module of claim 1 in which electronic components on said board are in thermal contact with said base plate.

9. The combination of claim 8 further including thermally conductive paste disposed between said base plate and said electric circuit components.

10. A convertible cooling module, especially for air or liquid cooling of electronic circuit components, said module comprising:
    a base;
    a plurality of thermally conductive plates affixed to said base, said plates being disposed parallel to one another, whereby a fluid flow path through said conductive plates is defined;
    flow path divider plate means disposed substantially perpendicularly to said plates so as to define at least two distinct fluid flow paths through said plates; and
    a liquid flow adapter which comprises a shroud which is sealably disposed around said plates, said shroud defining, in conjunction with said plates and said flow path divider plate means, a flow path in a first direction through said plates which are disposed on one side of said divider means and a flow path in an opposite direction on the other side of said divider means.

11. The module of claim 10 in which said shroud includes a flat mating portion which is sealably affixable to said base plate.

12. The module of claim 10 in which said shroud comprises a polymeric material.

13. The cooling module of claim 1 wherein said opposite side of said base contains irregularly shaped portions for making heat conducting contact to caps on said modules in said enclosure.

* * * * *